(12) United States Patent
Valin et al.

(10) Patent No.: US 9,425,820 B2
(45) Date of Patent: Aug. 23, 2016

(54) VECTOR QUANTIZATION WITH NON-UNIFORM DISTRIBUTIONS

(71) Applicants: Jean-Marc Valin, Montreal (CA); Timothy B. Terriberry, Mountain View, CA (US)

(72) Inventors: Jean-Marc Valin, Montreal (CA); Timothy B. Terriberry, Mountain View, CA (US)

(73) Assignee: Mozilla Corporation, Mountain View, CA (US)

( * ) Notice: Subject to any disclaimer, the term of this patent is extended or adjusted under 35 U.S.C. 154(b) by 353 days.

(21) Appl. No.: 14/295,212

(22) Filed: Jun. 3, 2014

(65) Prior Publication Data
US 2014/0358978 A1  Dec. 4, 2014

Related U.S. Application Data

(60) Provisional application No. 61/830,629, filed on Jun. 3, 2013.

(51) Int. Cl.
*G06F 7/00* (2006.01)
*H03M 7/30* (2006.01)

(52) U.S. Cl.
CPC ................... *H03M 7/3082* (2013.01)

(58) Field of Classification Search
CPC ................................... H03M 7/3082
USPC .................................... 708/201, 203
See application file for complete search history.

(56) References Cited

U.S. PATENT DOCUMENTS

| | | | | |
|---|---|---|---|---|
| 5,347,281 A * | 9/1994 | Lewis | ............... | G01S 7/36 342/116 |
| 5,839,110 A * | 11/1998 | Maeda | ............... | H04B 1/38 704/210 |
| 6,987,468 B1 * | 1/2006 | Malvar | ............... | H03M 7/46 341/59 |

* cited by examiner

*Primary Examiner* — Tan V. Mai
(74) *Attorney, Agent, or Firm* — Dergosits & Noah LLP; Todd A. Noah

(57) ABSTRACT

Systems and methods are described for encoding quantized vector parameters in a bitstream are described. An exemplary method may include receiving a vector of integers used in a data compression codebook, the sum of the integers equaling a pulse sum. An initial expected magnitude may be determined for a first integer, the initial expected magnitude being based on the pulse sum, a distribution parameter, and a value corresponding to a number of integers in the vector. The actual magnitude of the first integer may be encoded based on the initial expected magnitude of the first integer. The pulse sum may be adjusted using the encoded actual magnitude. Also, the value corresponding to the number of integers in the vector may be reduced by one. Expected magnitudes for each of the remaining integers of the vector may then be calculated recursively.

20 Claims, 6 Drawing Sheets

VECTOR QUANTIZATION WITH NON-UNIFORM DISTRIBUTIONS

CROSS-REFERENCE TO RELATED APPLICATIONS

This application claims priority to provisional U.S. patent application No. 61/830,629, filed on Jun. 3, 2013 and entitled "PVQ Encoding with Non-Uniform Distribution" which is incorporated herein in its entirety.

COPYRIGHT NOTICE

A portion of the disclosure of this patent document including any priority documents contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more implementations relate generally to digital communications, and more specifically to models for encoding non-uniform vector quantization parameters.

SUMMARY OF THE INVENTION

Systems and methods are described for efficiently encoding quantized vector parameters in a bitstream. Such techniques are particularly useful for encoding a series of vectors of integers used in a data compression codebook that have a non-uniform distribution, such as for compressed video. An exemplary method for encoding vectors of integers for transmission via a bitstream may include receiving, by a processor, a vector of integers used in a data compression codebook, the sum of the magnitudes of the integers equaling a pulse sum. The processor may determine an initial expected magnitude for a first integer of the vector of integers, the initial expected magnitude being based on the pulse sum, a distribution parameter, and a value corresponding to a number of integers in the vector of integers. An actual magnitude of the first integer may be encoded or decoded (by the processor) based on the initial expected magnitude of the first integer. The pulse sum may be adjusted, using the processor, using the encoded actual magnitude of the first integer. Also, the value corresponding to the number of integers in the vector may be reduced by one, also by the processor. The processor may then calculate expected magnitudes for each of the remaining integers in the vector recursively, based on the distribution parameter, the adjusted pulse sum and the reduced value corresponding to the number of integers in the vector.

In another embodiment, a vector of integers used in a data compression codebook is received by a processor, the sum of the number of pulses represented by the integers equaling a pulse sum, the integers being arranged in an order and the vector of integers including a plurality of non-zero integers, each non-zero integer vector having a corresponding position in the order of the vector of integers. An initial expected position of a first non-zero integer may be determined by the processor, the initial expected position being based on a distribution parameter, the pulse sum, and a value corresponding to a number of integers in the vector of integers. An actual position of the first non-zero integer may be encoded or decoded, using the processor, based on the expected position of the first non-zero integer. The pulse sum may be reduced by one (by the processor) and the value corresponding to the number of integers in the vector may be adjusted by the processor based on the encoded actual position of the first non-zero integer. A subsequent expected position for a subsequent non-zero integer in the vector of integers may be recursively determined by the processor, based on the distribution parameter, the reduced pulse sum and the adjusted value corresponding to the number of integers in the vector, the recursive determining continuing until the corresponding position for each of the plurality of non-zero integers in the vector has been determined or the adjusted value corresponding to the number of integers in the vector equals one.

In further embodiments, a vector of integers used in a data compression codebook may be received by a processor. The sum of the number of pulses represented by the integers may equal a pulse sum, the integers may be arranged in an order and the vector of integers may include a plurality of non-zero integers, each non-zero integer having a corresponding position in the order of the vector of integers. When the pulse sum is greater than a threshold, which may be fixed (e.g., at a value of one, two, or any suitable value) or based on the number of integers in the vector, an initial expected magnitude may be determined by the processor for a first integer of the vector of integers, the initial expected magnitude being based on the pulse sum, a first distribution parameter, and a value corresponding to a number of integers in the vector. An actual magnitude of the first integer may be encoded or decoded (by the processor) based on the initial expected magnitude of the first integer. The pulse sum may be adjusted by the processor using the encoded actual magnitude, and the value corresponding to the number of integers in the vector may be reduced by one by the processor. The processor may also calculate expected magnitudes for each of the remaining integers in the vector recursively based on the first distribution parameter, the adjusted pulse sum and the reduced value corresponding to the number of integers in the vector.

When the pulse sum is less than the threshold, which may be fixed or based on the number of integers in the vector, the processor may determine an initial expected position of a first non-zero integer in the order of integers, the initial expected position being based on a second distribution parameter, the pulse sum, and the value corresponding to a number of integers in the vector. An actual position of the first non-zero integer may be encoded or decoded, using the processor, based on the expected position of the first non-zero integer. The pulse sum may be reduced by one by the processor and the value corresponding to the number of integers in the vector may be adjusted by the processor based on the encoded actual position of the first non-zero integer. A subsequent expected position for a subsequent non-zero integer in the vector may then be determined recursively by the processor based on the second distribution parameter, the reduced pulse sum and the adjusted value corresponding to the number of integers in the vector. The recursion may continue until the corresponding position for each of the plurality of non-zero integers in the order of integers has been determined or the adjusted value corresponding to the number of integers in the vector equals one.

BRIEF DESCRIPTION OF THE DRAWINGS

In the following drawings like reference numbers are used to refer to like elements. Although the following figures

DETAILED DESCRIPTION

The transmission and storage of computer data increasingly relies on the use of codecs (coder-decoders) to compress/decompress digital media files to reduce the file sizes to manageable sizes to optimize transmission bandwidth and memory use. Transform coding is a common type of data compression for data that reduces signal bandwidth through the elimination of certain information in the signal. Subband coding is a type of transform coding that breaks a signal into a number of different frequency bands and encodes each one independently as a first step in data compression for audio and video signals. Transform coding is typically lossy in that the output is of lower quality than the original input. Many present compression techniques fail to remedy problems associated with compression artifacts, which are noticeable distortion effects caused by the application of lossy data compression, such as pre-echo, warbling, or ringing in audio signals, or ghost images in video data.

Figure 1:
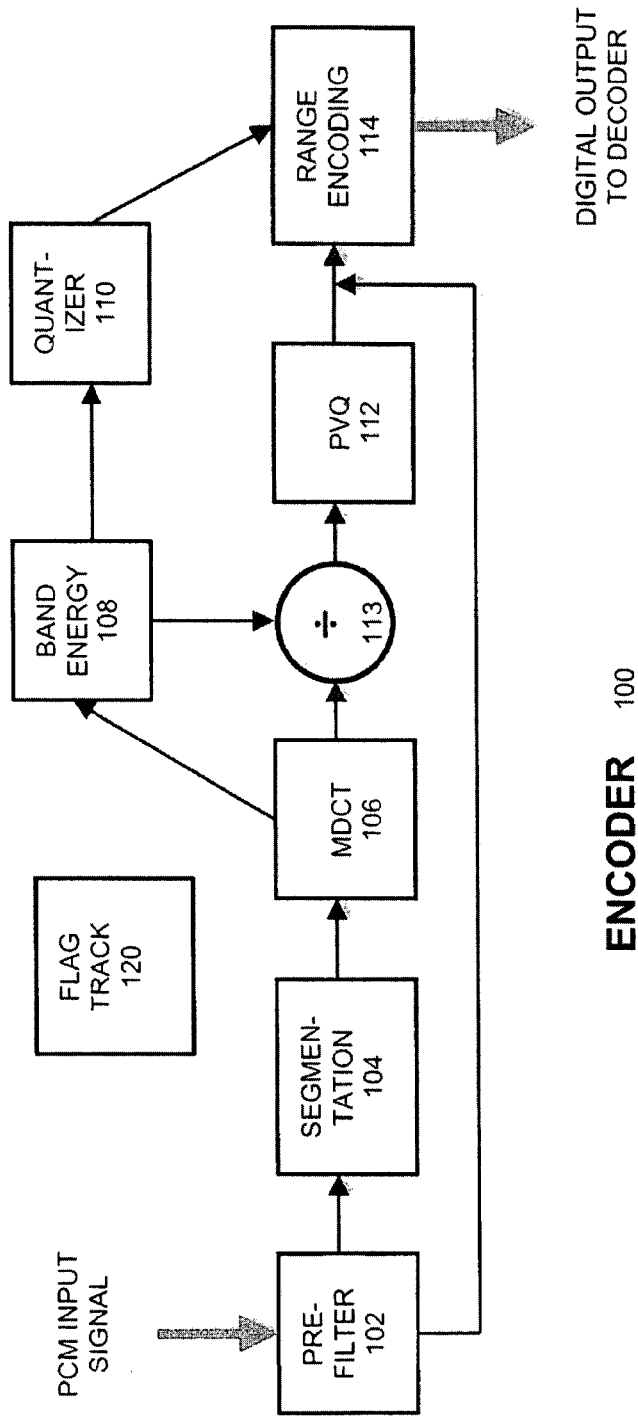
FIG. 1 is a block diagram of an encoder circuit for use in an audio coding system that includes a dynamic coefficient spreading mechanism, under an embodiment.

FIG. 1 is a block diagram of an encoder circuit for use in an audio coding system that includes a dynamic coefficient spreading mechanism, under an embodiment. The encoder 100 is a transform codec circuit based on the modified discrete cosine transform (MDCT) using a codebook for transform coefficients in the frequency domain. The input signal is a pulse-code modulated (PCM) signal that is input to a pre-filter stage 102. The PCM coded input signal is segmented into relatively small overlapping blocks by segmentation component 104. The block-segmented signal is input to the MDCT function block 106 and transformed to frequency coefficients through an MDCT function. Different block sizes can be selected depending on application requirements and constraints. For example, short block sizes allow for low latency, but may cause a decrease in frequency resolution. The frequency coefficients are grouped to resemble the critical bands of the human auditory system. The entire amount of energy of each group is analyzed in band energy component 108, and the values quantized in quantizer 110 for data reduction. The quantized energy values are compressed through prediction by transmitting only the difference to the predicted values (delta encoding). The unquantized band energy values are removed from the raw DCT coefficients (normalization) in function 113. The coefficients of the resulting residual signal (the so-called "band shape") are coded by Pyramid Vector Quantization (PVQ) block 112. PVQ is a form of spherical vector quantization using the lattice points of a pyramidal shape in multidimensional space as the quantizer codebook for quickly and efficiently quantizing Laplacian-like data, such as data generated by transforms or subband filters. This encoding process produces code words of fixed (predictable) length, which in turn enables robustness against bit errors and removes any need for entropy encoding. The output of the encoder is coded into a single bitstream by a range encoder 114. The bitstream output from the range encoder 114 is then transmitted to the decoder circuit.

In an embodiment, and in connection with the PVQ function 112, the encoder 100 uses a technique known as band folding, which delivers an effect similar to spectral band replication by reusing coefficients of lower bands for higher bands, while also reducing algorithmic delay and computational complexity. Also, in an embodiment, the exemplary encoding may be performed at function 113.

Figure 2:
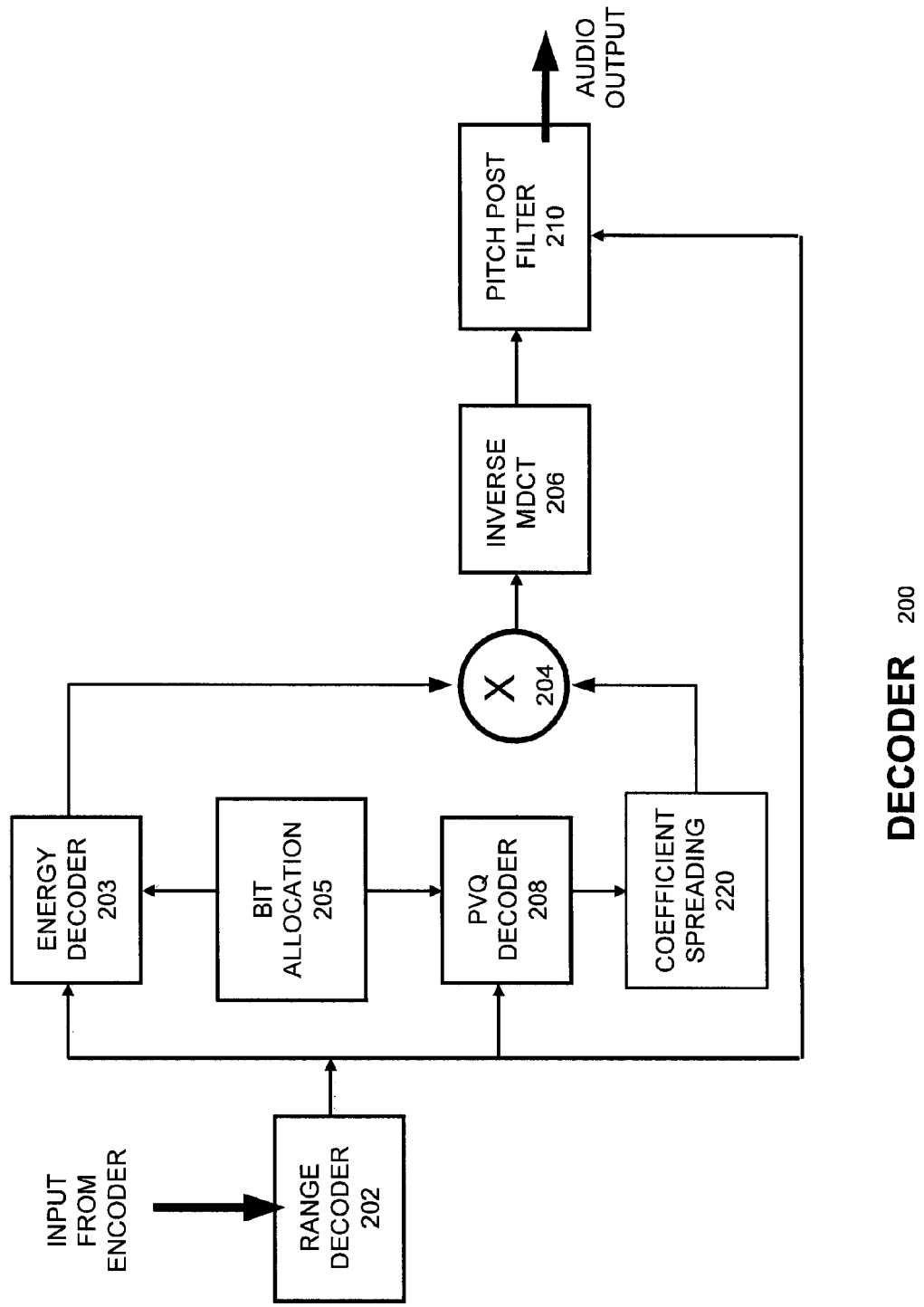
FIG. 2 is a block diagram of a decoder circuit for use in an audio coding system that includes a dynamic coefficient spreading mechanism, under an embodiment.

FIG. 2 is a block diagram of a decoder circuit for use in an audio coding system that includes a dynamic coefficient spreading mechanism, under an embodiment. The decoder 200 receives the encoded data from the encoder and processes the input signal through a range decoder 202. From the range decoder 202, the signal is passed through an energy decoder 203 and a PVQ decoder 208, and to pitch post filter 210. The values from PVQ decoder 208 are multiplied to the band shape coefficients by function 204, and then transformed back to PCM data through inverse MDCT function 206. The individual blocks may be rejoined using weighted overlap-add (WOLA) in folding block. Many parameters are not explicitly coded, but instead are reconstructed using the same functions as the encoder. The decoded signal is then processed through a pitch post filter 210 and output to an audio output circuit, such as audio speaker(s). In the embodiment of FIG. 2, a coefficient spreading function 220 provides coefficient spreading information that is combined with decoded energy values in function 204. A bit allocation block 205 provides bit allocation data to the energy decoder 203 and PVQ decoder 208. A similar bit allocation block may be provided on the encoder side between quantizer 110 and PVQ 112 for symmetry between the encoder and decoder. In the exemplary embodiment, the methods described herein may be implemented in PVQ decoder 208.

A transform codec circuit based on a possibly-overlapped block transform may use a codebook for transform coefficients in the frequency domain. The input signal may be a pulse-code modulated (PCM) signal. The PCM-coded input signal may be segmented into overlapping blocks. The block-segmented signal may be transformed to frequency coefficients through a transform function, such as the discrete cosine transform (DCT). The entire amount of energy of each block may be analyzed and then quantized for data reduction. The quantized energy values may be compressed through prediction by transmitting only the difference to the predicted values (delta encoding). The unquantized energy values may be removed from the raw coefficients (normalization). The coefficients of the resulting residual signal (the so-called "shape") may be coded by Pyramid Vector Quantization (PVQ). PVQ is a form of spherical vector quantization using the lattice points of a pyramidal shape in multidimensional space as the quantizer codebook for quickly and efficiently quantizing Laplacian-like data, such as data generated by transforms or subband filters. This encoding process produces a vector of integers with a known pulse sum. The output of the encoder may be coded into a single bitstream by a range encoder. The bitstream output from the range encoder may then be transmitted to a decoder circuit. PVQ may be useful in the context of both audio and video compression.

The PVQ codebook may be defined in some embodiments as follows:

$$S(N, K) = \left\{ y \in \mathbb{Z}^N : \sum_{i=0}^{N-1} |y_i| = K \right\} \quad (1)$$

That is, the codebook may include the set of all integer vectors y in N dimensions for which the sum of absolute values equals K. When all codevectors are considered to have equal probability, several existing methods may be used to convert between any codevector and an index J in the range [0,V(N,K)−1], where V (N,K) is the number of elements in S(N,K). The index may then be coded in a bit-stream, possibly with the use of a range encoder to allow for fractional bits since V (N,K) is generally not a power of two. The equal-probability case may be common for audio. For video, however, transform coefficients (e.g. DCT) or any prediction residual for a block tend to have widely different distributions. For this reason, using a uniform probability model may be inadequate to describe the codevectors of the PVQ codebook.

Figure 3:
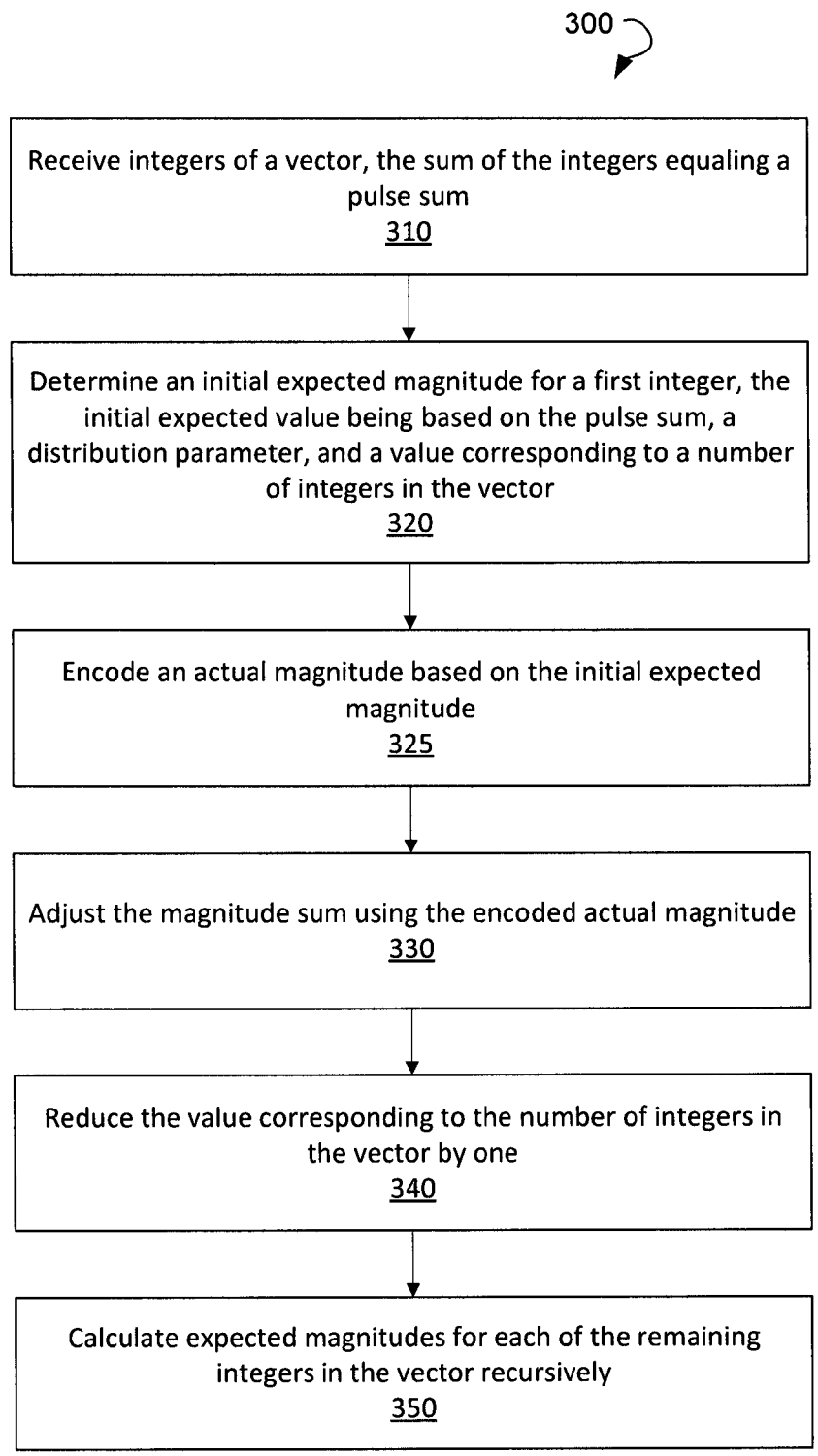
FIG. 3 is a flowchart of an exemplary method for encoding vectors of integers for transmission via a bitstream in accordance with various embodiments of the present invention.
Figure 4:
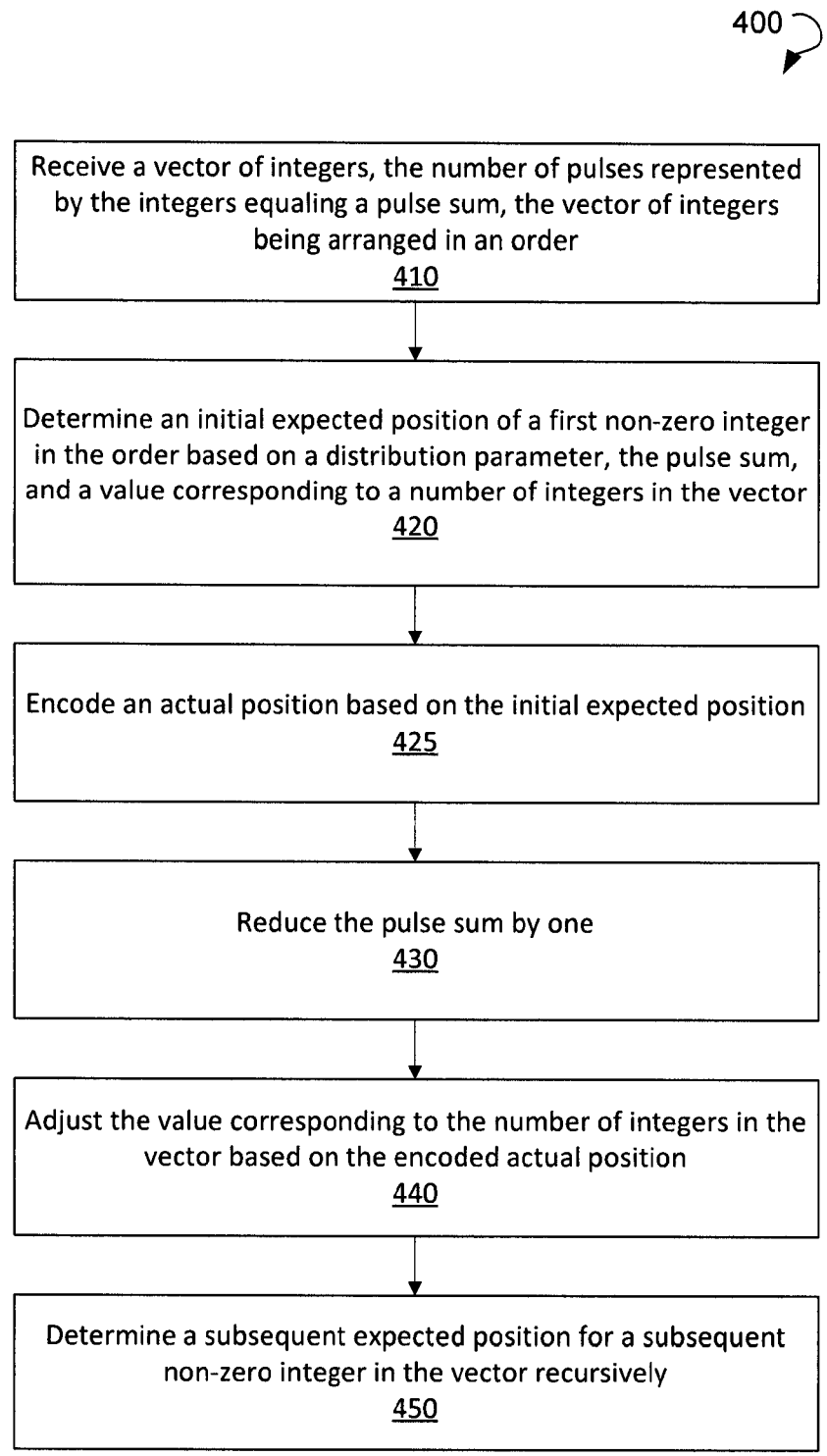
FIG. 4 is a flowchart of an exemplary method for encoding vectors of integers for transmission via a bitstream in accordance with various embodiments of the present invention.
Figure 5:
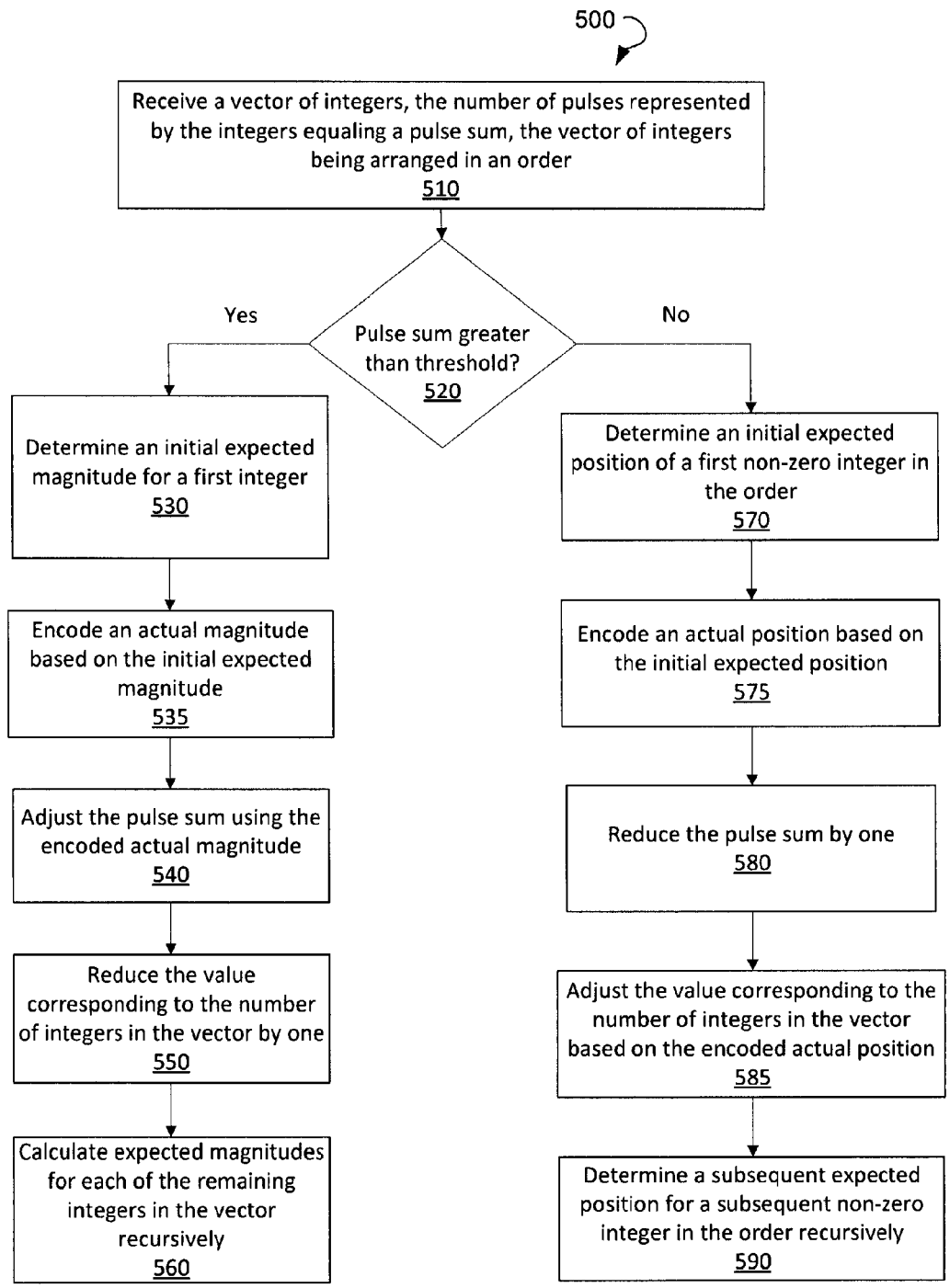
FIG. 5 is a flowchart of an exemplary method for encoding vectors of integers for transmission via a bitstream in accordance with various embodiments of the present invention.

The non-uniform probability distribution of the codevectors may be modeled by a probability model. For any codebook of reasonable size, explicitly modeling the distribution of J itself may be impractical since V (N,K) can exceed 32 bits. Instead, parametric models may be used for the distribution of |yi| as a function of i. FIGS. 3-5 and the accompanying text describes exemplary models for encoding non-uniform PVQ parameters. The described models may be implemented using a range/arithmetic coder, and preferable a coder that may encode non-binary symbols. In some embodiments, the probability distribution functions (pdfs) can be stored in a lookup table in the form of cumulative distribution functions (cdfs) that can be used directly by the encoder and decoder. The cdfs may be derived by taking the integral of a corresponding pdf.

To facilitate an understanding of the subject matter described below, many aspects are described in terms of sequences of actions. At least one of these aspects defined by the claims is performed by an electronic hardware component. For example, it will be recognized that the various actions can be performed by specialized circuits or circuitry, by program instructions being executed by one or more processors, or by a combination of both. The description herein of any sequence of actions is not intended to imply that the specific order described for performing that sequence must be followed. All methods described herein can be performed in any suitable order unless otherwise indicated herein or otherwise clearly contradicted by context.

Aspects of the one or more embodiments described herein may be implemented on one or more computers or processor-based devices executing software instructions. The computers may be networked in a peer-to-peer or other distributed computer network arrangement (e.g., client-server), and may be included as part of an audio and/or video processing and playback system.

FIG. 3 is a flowchart of an exemplary method 300 for encoding vectors of integers for transmission via a bitstream in accordance with various embodiments of the present invention. Exemplary method 300, which may also be referred to as the coefficient magnitude (CM) model, is based on determining the expected absolute value of the integer $y_i$ at the ith position of the set of integer coefficients. At step 310 integers of a vector used in a data compression codebook are received, the sum of the integers equaling a pulse sum. The codebook may be generated by PVQ quantization, as described above, or by scalar quantization.

To encode the integers of the received vector, the expected magnitude of the coefficient i may be determined as follows:

$$\sigma_i = E\{|y_i|\} \quad (2)$$

$$= \sum_{k=0}^{\infty} p_i(k)$$

In equation 2, $p_i(k)$ may represent the probability that $|y_i|=k$. The integer y may be the result of quantizing x to the nearest integer, where x follows a Laplace distribution:

$$p(x) = r^{-|x|} \quad (3)$$

In the exemplary embodiment, the positive quantization thresholds are θ+k, k ∈ N, and accordingly:

$$p(k) = \begin{cases} 1 - r^\theta, & k = 0 \\ r^\theta(1-r)r^{k-1}, & k \neq 0 \end{cases} \quad (4)$$

The value of decay factor r may be obtained by modelling $\sigma_i$. By assuming θ=1, the following expression may be used to determine decay factor r:

$$r = \frac{\sigma_i}{1 + \sigma_i} \quad (5)$$

Other values of θ may be used to model p(k) itself, in which case equation 5 becomes an approximation. Typically, θ is in the range [0.5, 1] in exemplary embodiments. For efficiency reasons, cdfs corresponding to p (k) for different values of r may be predetermined, and stored in look-up tables separately available to both the encoder and the decoder. Efficiency may be accordingly improved, since the pdfs do not need to be determined for received/transmitted coefficients.

At step 320, the processor may determine an initial expected magnitude for a first integer of the vector of integers, the initial expected magnitude being based on the pulse sum, a distribution parameter, and a value corresponding to a number of integers in the vector (the dimension of the vector). If all the magnitudes of $y_i$ are identically distributed, then all expected magnitudes $\sigma_i$ are equal and $\sigma_i = K/N$. However, in various embodiments the vector of integers may be non-uniform, whereby the the integer magnitudes are not identically distributed. In such vectors having non-identically-distributed coefficients, the values $y_i$ may be ordered in decreasing order of expected magnitude. In an exemplary embodiment, the initial expected magnitude $\sigma_0$ may be represented as $$\sigma_0 = \min(\alpha K/N, K) \quad (6)$$

The parameter α may be defined as a distribution parameter representing how unevenly distributed the integers in the vector are (α=1 may correspond to identical distributions). In some embodiments, distribution parameter α is equal to a constant value greater than one.

Knowing α, we can obtain $\sigma_0$, $r_0$ and thus $p_0$ (k), making it possible to encode (and decode using the same process) actual initial magnitude $y_0$. The actual initial magnitude may be encoded based on the initial expected magnitude at step 325. The encoding may include being encoded into a bitstream. In exemplary embodiments, the signs of any non-zero integers in the vector may be separately encoded into the bitstream. The pulse sum may be adjusted, using the processor, using the encoded actual magnitude at step 330. Also, the value corresponding to the number of integers in the vector may be reduced by one, also by the processor, at step 340. This may be performed for example, by modifying the values of N and K as shown in equations 7.

$$N^{(1)}=N-1$$
$$K^{(1)}=K-|y_0| \quad (7)$$

The processor may then calculate expected magnitudes for each of the remaining integers in the vector recursively, based on the distribution parameter, the adjusted pulse sum and the reduced value corresponding to the number of integers in the vector at step 350. Knowing the magnitude of $y_0$, $y_1$ may be derived using $N^{(1)}$ and $K^{(1)}$ as derived above. The process can be applied recursively until the adjusted pulse sum $K^i=0$ or the reduced value corresponding to the number of integers in the vector $N^i=1$.

Once an expected magnitude for an integer in the vector has been determined, equation 4 above may be used to determine the pdf for the magnitude of the corresponding integer in the vector. After the pdf is determined, the pdf may be converted to a cdf for use by the encoder/decoder in transmission. Alternatively, once decay factor r has been determined, a lookup table available to both the encoder and the decoder may be used to identify cdfs for each value of r. Such embodiments may be advantageous, in that the need for processing the r values to calculate p(k) for each value of i may be eliminated. Given the cdfs, the magnitudes of $y_i$ may be encoded to or decoded from a bitstream using a range coder or arithmetic coder. As stated above, the signs of the non-zero $y_i$ values may also be encoded or decoded, either directly in the bitstream or using a suitable entropy coder.

While method 300 is described in terms of encoding the integers of the vector into a bitstream, method 300 may also be adapted for decoding a received bitstream that includes vectors of integers. The bitstream may be received, and each integer may be recursively decoded using the pulse sum (which may also be received), the value corresponding to a number of integers in the vector, and the distribution parameter.

In some embodiments, the distribution parameter α may be held constant across all blocks. In other exemplary embodiments, α may be assumed constant across a vector (and all the integers therein) and adapted between integer vectors based on the observed expectation $\sigma_i$ as a function of K and N. The adapting may include modifying the distribution parameter based on an adaptation rate value. Similar to a linear regression:

$$\alpha = \frac{S_y}{S_E} \quad (8)$$

For new vector, running sums Sy and SE may be updated as follows:

$$S_y \leftarrow (1-\eta)S_y + \eta \Sigma |y_i| \quad (9)$$
$$S_E \leftarrow (1-\eta)S_E + \eta \Sigma (K^{(i)}/N^{(i)}) \quad (10)$$

where adaptation rate value η controls the adaptation rate, and the summation is over all i in the current vector. The total number of symbols coded with this approach may be equal to the position $i_{last}$ of the last non-zero component of y.

FIG. 4 is a flowchart of an exemplary method 400 for encoding integers of a vector for transmission via a bitstream in accordance with various embodiments of the present invention. Exemplary method 400 may be used to determine a run-length (RL) model of the integer distribution of a vector. Integers of a vector used in a data compression codebook are received by a processor at step 410. The sum of the number of pulses represented by the integers in the vector of integers may equal a pulse sum, representing the number of pulses in the vector of integers. The integers in the vector may be arranged in an order, and may include a plurality of non-zero integers in the order and a plurality of zero integers. Each non-zero integer may have a corresponding position in the order of the set of integer vectors. For example, a vector of integers may be represented as [3,0,0,2,0,0,0,1]. The first non-zero integer in the order would include three pulses, and would be located in the first position in the order of the integers.

To identify non-zero integers, q(n), the probability of $y_n$ being the first non-zero coefficient in the set of integers, may be modeled. The probability model for q(n) may be modeled as a truncated exponential distribution $$q(n) = C_1 \begin{cases} r^{-n}, & n < N \\ 0, & n \geq N, \end{cases} \quad (11)$$

where $C_1$ is a normalization constant. An initial expected position of a first non-zero integer may be determined by the processor at step 420, the initial expected position being based on a distribution parameter, the pulse sum, and a value corresponding to a number of integers in the vector. The expected value of q(n) may be modeled in some embodiments as:

$$\sigma_n = E[q(n)] \quad (12)$$
$$= \beta \cdot \frac{N}{K},$$

Where β is the distribution parameter, N is the number of integers vectors in the vector, and K is the pulse sum. However, in some embodiments, such as in many video compression applications, the integers may be non-uniformly distributed, whereby the non-zero integers are not evenly distributed in the order of the integers. For non-uniform integer vectors, the distribution parameter β may have a constant value less than one. The relationship between $\sigma_n$ and decay constant r may be represented as:

$$\sigma_n = \frac{r^N - Nr + N - 1}{r^{N-1}(1-r)^N}, \quad (13)$$

A simplified solution for the decay constant r may take the following form:

$$r \approx \frac{\sigma_n}{1+\sigma_n} + \frac{8\sigma_n^2}{(N+1)(N-1)^2} \quad (14)$$

An actual position of the first non-zero integer of the vector may be encoded (or decoded) based on the initial expected position of the first non-zero integer at step 425. The pulse sum may be reduced by one (by the processor) at step 430 and the value corresponding to the number of integers in the vector may be adjusted by the processor based on the initial expected position at step 440. That is, once the position n of the first non-zero coefficient is coded at step 420, one pulse may be subtracted from that position and the adapting the distribution parameter may include subtracting the initial expected position from the number of integers in the vector. The process may be restarted with:

$$N^{(1)} = N - n$$

$$K^{(1)} = K - 1 \quad (15)$$

A subsequent expected position for a subsequent non-zero integer in the order of integers may be recursively determined by the processor, based on the distribution parameter $\beta$, the reduced pulse sum $K^{n+1}$ and the adjusted value corresponding to the number of integers in the vectors $N^{n+1}$. The recursive determining may continue until the corresponding position for each of the plurality of non-zero integers of the vector has been determined at step 450, or the adjusted value corresponding to the number of integers in the vector equals one. If multiple pulses are present at a certain position, a position of zero may be encoded for each pulse that follows the first pulse. This may be accomplished by giving the corresponding position for each pulse that follows the first pulse a value of zero. Because, in some embodiments, the sign of subsequent pulses is fixed once a pulse is already present at a certain position, the probability of adding a pulse is divided by two. The probability distribution at the position may then become:

$$q(n) = C_2 \begin{cases} 1/2, & n = 0 \\ r^{-n}, & 0 < n < N \\ 0, & n \geq N \end{cases} \quad (16)$$

The $\beta$ distribution parameters may be adapted in a similar way as the $\alpha$ distribution parameter described above:

$$\beta = \frac{S_P}{S_N} \quad (17)$$

where for new vector, Sp and SN may be updated as:

$$S_P \leftarrow (1-\eta)S_P + \eta \Sigma n^{(i)} K^{(i)}$$

$$S_N \leftarrow (1-\eta)S_N + \eta \Sigma N^{(i)}. \quad (18)$$

Adaptation parameter $\eta$ may control the adaptation rate of the distribution parameter $\beta$.

It is possible to combine the CM and RL models to improve coding performance and computational efficiency. For small values of pulse sum K, the RL model may have similar efficiency as the CM model, but a much lower complexity due to the smaller number of symbols. For larger K values, the RL model may lose efficiency and become more complex. Because K is known in advance, the encoder can, in some embodiments choose between CM and RL at run-time based on K. The decoder has access to the same information and can thus choose the same model as the encoder. It is even possible to use both models on the same vector, switching from CM to RL once adjusted pulse sum $K^{(n)}$ becomes smaller than an encoder-decoder-agreed pulse threshold $K_T$. The pulse threshold $K_\tau$ may be set to any desired value, and in some embodiments may be set to equal the number of integers in the vector of integers N.

FIG. 5 is a flowchart of an exemplary method 500 for encoding vectors of integers for transmission via a bitstream in accordance with various embodiments of the present invention. Method 500 is an embodiment for encoding integers that combines the CM and RL models. A vector of integers used in a data compression codebook may be received by a processor at step 510. The sum of the number of pulses represented by the integers of the vector may equal a pulse sum K, the integers of the vector may be arranged in an order and may include a plurality of non-zero integers, each non-zero integer having a corresponding position in the order of the vector of integers. At step 520, the pulse sum K is compared to a threshold. The threshold, also referred to as the pulse threshold, may be a fixed value, such as one, two, or any suitable value, or may be variable. For example, the pulse threshold may be set to equal the number of integers in the vector N. At step 520, if K is greater than the threshold, which may be fixed or based on the number of integers in the vector, an initial expected magnitude may be determined by the processor for a first integer of the vector at step 530, the initial expected magnitude being based on the pulse sum, a first distribution parameter $\alpha$, and a value corresponding to a number of integers in the vector. The actual magnitude for the first integer may be encoded based on the initial expected magnitude at step 535. The pulse sum may be adjusted by the processor using the initial expected magnitude at step 540, and the value corresponding to the number of integers in the vector may be reduced by one by the processor at step 550. The processor may then calculate expected magnitudes for each of the remaining integers of the vector recursively at step 560. The expected magnitudes may be based on the first distribution parameter, the adjusted pulse sum and the reduced value corresponding to the number of integers in the vector.

When, at step 520, the pulse sum is less than the number of integers in the vector, the processor may determine an initial expected position of a first non-zero integer in the order of integers at step 570. The initial expected position n may be based on a second distribution parameter $\beta$, the pulse sum, and the value corresponding to a number of integers in the vector. An actual position of the first non-zero integer of the vector may be encoded (or decoded) based on the initial expected position of the first non-zero integer at step 575. The pulse sum may be reduced by one by the processor at step 580 and the value corresponding to the number of integers in the vector may be adjusted by the processor based on the initial expected position at step 585. A subsequent expected position for a subsequent non-zero integer in the order of integers may then be determined recursively by the processor at step 590. The subsequent expected position may be based on the second distribution parameter, the reduced pulse sum and the adjusted value corresponding to the number of integers in the vector. The recursion may continue until the corresponding position for each of the plurality of non-zero integers in the vector has been determined or the adjusted value corresponding to the number of integers in the vector equals one.

Figure 6:
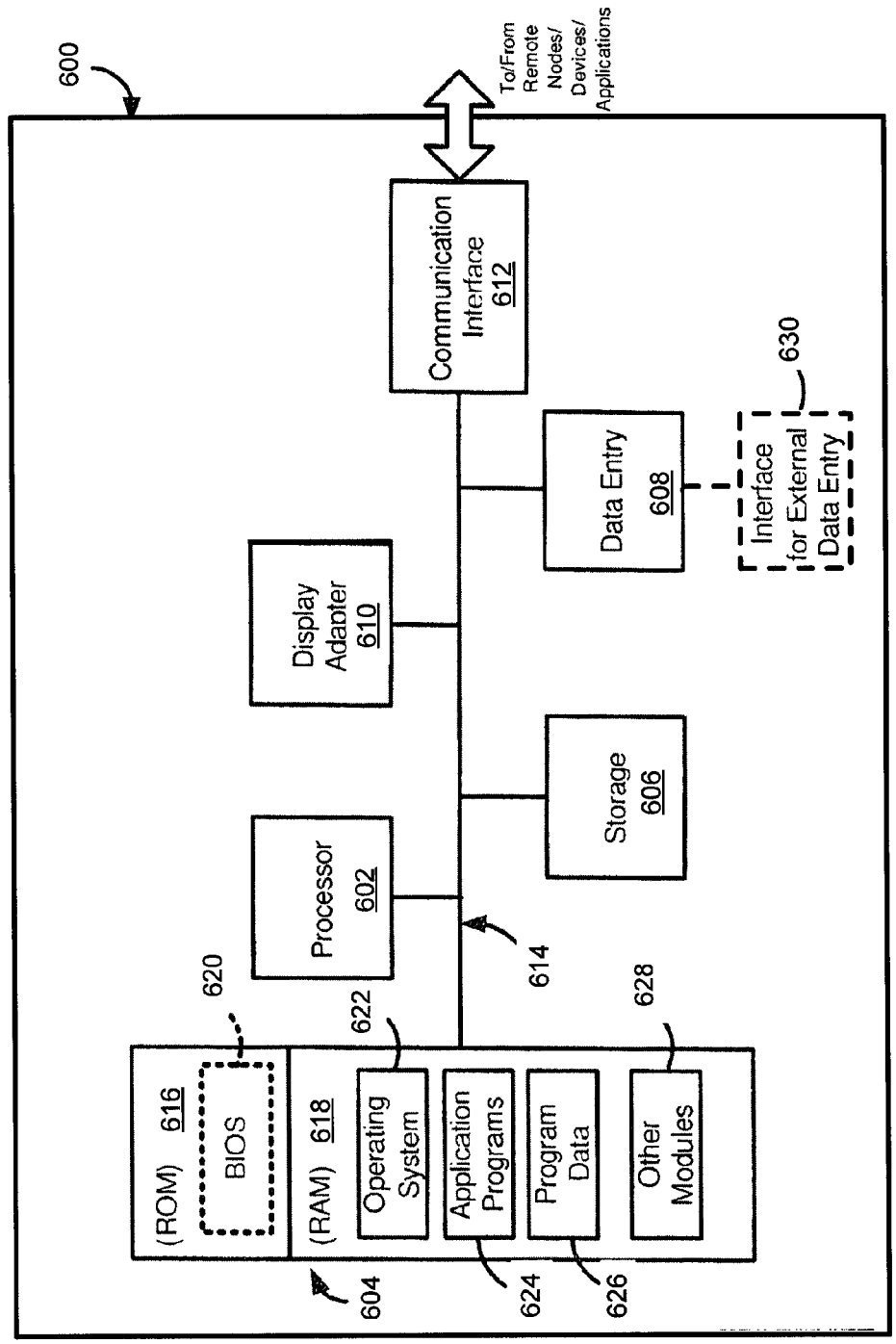
FIG. 6 is a block diagram of an exemplary system for encoding vectors of integers for transmission via a bitstream in accordance with various embodiments of the present invention.

In some contexts, a predetermined value of the pulse sum K may be agreed on between the encoder and decoder. However, in other embodiments, the value of K may not be predetermined, and K must be coded into the bitstream. In an exemplary embodiment, the pdf of K may be adapted based on the data for K<15 (the first fifteen pulses). For K≥15, an exponentially-decaying distribution may be assumed. A different pdf may be used for each expected value of K. With reference to FIG. 6, an exemplary system for implementing the subject matter disclosed herein, including the methods described above, includes a hardware device 600, including a processing unit 602, memory 604, storage 606, data entry module 608, display adapter 610, communication interface 612, and a bus 614 that couples elements 604-612 to the processing unit 602.

The bus 614 may comprise any type of bus architecture. Examples include a memory bus, a peripheral bus, a local bus, etc. The processing unit 602 is an instruction execution machine, apparatus, or device and may comprise a microprocessor, a digital signal processor, a graphics processing unit, an application specific integrated circuit (ASIC), a field programmable gate array (FPGA), etc. The processing unit 602 may be configured to execute program instructions stored in memory 604 and/or storage 606 and/or received via data entry module 608.

The memory 604 may include read only memory (ROM) 616 and random access memory (RAM) 618. Memory 604 may be configured to store program instructions and data during operation of device 600. In various embodiments, memory 604 may include any of a variety of memory technologies such as static random access memory (SRAM) or dynamic RAM (DRAM), including variants such as dual data rate synchronous DRAM (DDR SDRAM), error correcting code synchronous DRAM (ECC SDRAM), or RAMBUS DRAM (RDRAM), for example. Memory 604 may also include nonvolatile memory technologies such as nonvolatile flash RAM (NVRAM) or ROM. In some embodiments, it is contemplated that memory 604 may include a combination of technologies such as the foregoing, as well as other technologies not specifically mentioned. When the subject matter is implemented in a computer system, a basic input/output system (BIOS) 620, containing the basic routines that help to transfer information between elements within the computer system, such as during start-up, is stored in ROM 616.

The storage 606 may include a flash memory data storage device for reading from and writing to flash memory, a hard disk drive for reading from and writing to a hard disk, a magnetic disk drive for reading from or writing to a removable magnetic disk, and/or an optical disk drive for reading from or writing to a removable optical disk such as a CD ROM, DVD or other optical media. The drives and their associated computer-readable media provide nonvolatile storage of computer readable instructions, data structures, program modules and other data for the hardware device 600.

It is noted that the methods described herein can be embodied in executable instructions stored in a non-transitory computer readable medium for use by or in connection with an instruction execution machine, apparatus, or device, such as a computer-based or processor-containing machine, apparatus, or device. It will be appreciated by those skilled in the art that for some embodiments, other types of computer readable media may be used which can store data that is accessible by a computer, such as magnetic cassettes, flash memory cards, digital video disks, Bernoulli cartridges, RAM, ROM, and the like may also be used in the exemplary operating environment. As used here, a "computer-readable medium" can include one or more of any suitable media for storing the executable instructions of a computer program in one or more of an electronic, magnetic, optical, and electromagnetic format, such that the instruction execution machine, system, apparatus, or device can read (or fetch) the instructions from the computer readable medium and execute the instructions for carrying out the described methods. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

A number of program modules may be stored on the storage 606, ROM 616 or RAM 618, including an operating system 622, one or more applications programs 624, program data 626, and other program modules 628. A user may enter commands and information into the hardware device 600 through data entry module 608. Data entry module 608 may include mechanisms such as a keyboard, a touch screen, a pointing device, etc. Other input devices (not shown) are connected to the hardware device 600 via external data entry interface 630. By way of example and not limitation, external input devices may include a microphone, joystick, game pad, satellite dish, scanner, or the like. In some embodiments, external input devices may include video or audio input devices such as a video camera, a still camera, etc. Data entry module 608 may be configured to receive input from one or more users of device 600 and to deliver such input to processing unit 602 and/or memory 604 via bus 614.

The hardware device 600 may operate in a networked environment using logical connections to one or more remote nodes (not shown) via communication interface 612. The remote node may be another computer, a server, a router, a peer device or other common network node, and typically includes many or all of the elements described above relative to the hardware device 600. The communication interface 612 may interface with a wireless network and/or a wired network. Examples of wireless networks include, for example, a BLUETOOTH network, a wireless personal area network, a wireless 802.11 local area network (LAN), and/or wireless telephony network (e.g., a cellular, PCS, or GSM network). Examples of wired networks include, for example, a LAN, a fiber optic network, a wired personal area network, a telephony network, and/or a wide area network (WAN). Such networking environments are commonplace in intranets, the Internet, offices, enterprise-wide computer networks and the like. In some embodiments, communication interface 612 may include logic configured to support direct memory access (DMA) transfers between memory 604 and other devices.

In a networked environment, program modules depicted relative to the hardware device 600, or portions thereof, may be stored in a remote storage device, such as, for example, on a server. It will be appreciated that other hardware and/or software to establish a communications link between the hardware device 600 and other devices may be used.

It should be understood that the arrangement of hardware device 600 illustrated in FIG. 1 is but one possible implementation and that other arrangements are possible. It should also be understood that the various system components (and means) defined by the claims, described above, and illustrated in the various block diagrams represent logical components that are configured to perform the functionality described herein. For example, one or more of these system components (and means) can be realized, in whole or in part, by at least some of the components illustrated in the arrangement of hardware device 600. In addition, while at least one of these components are implemented at least partially as an electronic hardware component, and therefore constitutes a machine, the other components may be implemented in software, hardware, or a combination of software and hardware. More particularly, at least one component defined by the claims is implemented at least partially as an electronic hardware component, such as an instruction execution machine (e.g., a processor-based or processor-containing machine) and/or as specialized circuits or circuitry (e.g., discrete logic gates interconnected to perform a specialized function), such as those illustrated in FIG. 1. Other components may be implemented in software, hardware, or a combination of software and hardware. Moreover, some or all of these other components may be combined, some may be omitted altogether, and additional components can be added while still achieving the functionality described herein. Thus, the subject matter described herein can be embodied in many different variations, and all such variations are contemplated to be within the scope of what is claimed.

In the description that follows, the subject matter will be described with reference to acts and symbolic representations of operations that are performed by one or more devices, unless indicated otherwise. As such, it will be understood that such acts and operations, which are at times referred to as being computer-executed, include the manipulation by the processing unit of data in a structured form. This manipulation transforms the data or maintains it at locations in the memory system of the computer, which reconfigures or otherwise alters the operation of the device in a manner well understood by those skilled in the art. The data structures where data is maintained are physical locations of the memory that have particular properties defined by the format of the data. However, while the subject matter is being described in the foregoing context, it is not meant to be limiting as those of skill in the art will appreciate that various of the acts and operation described hereinafter may also be implemented in hardware.

For purposes of the present description, the terms "component," "module," and "process," may be used interchangeably to refer to a processing unit that performs a particular function and that may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for encoding integers for transmission via a bitstream, the method comprising:
    receiving, by a processor, a vector of integers used in a data compression codebook, the sum of the integers equaling a pulse sum;
    determining, by the processor, an initial expected magnitude for a first integer of the vector of integers, the initial expected magnitude being based on the pulse sum, a distribution parameter, and a value corresponding to a number of integers in the vector of integers;
    encoding, by the processor, an actual magnitude of the first integer based on the initial expected magnitude;
    adjusting, by the processor, the pulse sum using the encoded actual magnitude;
    reducing, by the processor, the value corresponding to the number of integers in the vector by one; and
    calculating, by the processor, expected magnitudes for each of the remaining integers in the vector recursively based on the distribution parameter, the adjusted pulse sum and the reduced value corresponding to the number of integers in the vector.

2. The method of claim 1 wherein the vector of integers is non-uniform, whereby the magnitudes of the integers are not identically distributed.

3. The method of claim 1 wherein the calculating, by the processor, expected magnitudes for each of the remaining integers in the vector recursively is performed until the adjusted pulse sum equals zero or when the reduced value corresponding to the number of integers in the vector equals one.

4. The method of claim 1 wherein the distribution parameter represents how unevenly distributed the integers in the vector are, and wherein the distribution parameter has a constant value greater than one.

5. The method of claim 1, further comprising adapting the distribution parameter for each of the remaining integers in the vector, the adapting comprising modifying the distribution parameter based on an adaptation rate value.

6. The method of claim 1, further comprising determining a probability distribution based on a decay factor and the expected magnitudes of each of the integers in the vector.

7. The method of claim 1, where the initial expected magnitude is equal to the adaptation parameter multiplied by the pulse sum divided by the number of integers in the vector.

8. A method for encoding integers for transmission via a bitstream, the method comprising:

receiving, by a processor, a vector of integers used in a data compression codebook, the sum of the number of pulses represented by the integers equaling a pulse sum, the integers being arranged in an order and the vector of integers including a plurality of non-zero integers, each non-zero integer having a corresponding position in the order of the vector of integers;

determining, by a processor, an initial expected position of a first non-zero integer, the initial expected position being based on a distribution parameter, the pulse sum, and a value corresponding to a number of integers in the vector of integers;

encoding, by the processor, an actual position of the first non-zero integer based on the initial expected position of the first non-zero integer;

reducing, by the processor, the pulse sum by one;

adjusting, by the processor, the value corresponding to the number of integers in the vector based on the encoded actual position; and determining, by the processor, a subsequent expected position for a subsequent non-zero integer in the vector of integers recursively based on the distribution parameter, the reduced pulse sum and the adjusted value corresponding to the number of integers in the vector, the recursive determining continuing until the corresponding position for each of the plurality of non-zero integers in the vector has been determined.

9. The method of claim 8 wherein the vector of integers is non-uniform, whereby the non-zero integers are not evenly distributed in the order of the vector.

10. The method of claim 8 wherein the distribution parameter corresponds to how unevenly distributed the non-zero integers are in the order of the vector of integers, and wherein the distribution parameter has a constant value less than one.

11. The method of claim 8, further comprising: receiving additional vectors of integers; and adapting the distribution parameter for each of the additional vectors, the adapting the distribution parameter comprising modifying the distribution parameter based on an adaptation rate value.

12. The method of claim 8 wherein the adjusting, by the processor, the value corresponding to the number of integers in the vector based on the initial expected position comprises subtracting the initial expected position from the number of number of integers in the vector.

13. The method of claim 8 wherein when multiple pulses are present at a specific position, the corresponding position for each pulse that follows the first pulse is given a zero value.

14. The method of claim 8 wherein after the corresponding position of a non-zero integer is determined, the probability of adding an additional pulse at the corresponding position is divided by two.

15. The method of claim 8, wherein the recursive determining is ended when the adjusted value corresponding to the number of integers in the vector equals one.

16. A method for encoding integers of a vector for transmission via a bitstream, the method comprising:

receiving, by a processor, a vector of integers used in a data compression codebook, the sum of a number of pulses represented by the integers equaling a pulse sum, the integers being arranged in an order and the vector of integers including a plurality of non-zero integer vectors, each non-zero integer vector having a corresponding position in the order of the set of integer vectors;

when the pulse sum is greater than a pulse threshold:
determining, by the processor, an initial expected magnitude for a first integer of the vector of integers, the initial expected magnitude being based on the pulse sum, a first distribution parameter, and a value corresponding to the number of integers in the vector of integers;

adjusting, by the processor, the pulse sum using the initial expected magnitude;

reducing, by the processor, the value corresponding to the number of integers in the vector of integers by one; and calculating, by the processor, expected magnitudes for each of the remaining integers in the vector recursively based on the first distribution parameter, the adjusted pulse sum and the reduced value corresponding to the number of integers in the vector ; and when the pulse sum is less than the pulse threshold:
determining, by the processor, an initial expected position of a first non-zero integer in the order of integers, the initial expected position being based on a second distribution parameter, the pulse sum, and the value corresponding to the number of integers in the vector;

reducing, by the processor, the pulse sum by one;

adjusting, by the processor, the value corresponding to the number of integers in the vector based on the initial expected position; and determining, by the processor, a subsequent expected position for a subsequent non-zero integer in the vector recursively based on the second distribution parameter, the reduced pulse sum and the adjusted value corresponding to the number of integers in the vector, the recursive determining continuing until the corresponding position for each of the plurality of non-zero integers in the vector has been determined.

17. The method of claim 16, further comprising, when the pulse sum is greater than the pulse threshold:

comparing the adjusted pulse sum to the pulse threshold; and when the adjusted pulse sum is less than the pulse threshold:
determining, by the processor, an initial expected position of a first non-zero integer vector, the initial expected position being based on a second distribution parameter, the adjusted pulse sum, and the reduced value corresponding to a number of integers in the vector;

reducing, by the processor, the adjusted pulse sum by one;

adjusting, by the processor, the reduced value corresponding to the number of integers in the vector based on the initial expected position; and determining, by the processor, a subsequent expected position for a subsequent non-zero integer in the vector recursively based on the second distribution parameter, the reduced adjusted pulse sum and the adjusted reduced value corresponding to the number of integers in the vector, the recursive determining continuing until the corresponding position for each of the plurality of non-zero integers in the vector has been determined.

18. The method of claim 17 wherein the pulse threshold is equal to the value corresponding to the number of integers in the vector.

19. The method of claim 16, wherein the recursive determining is ended when the adjusted value corresponding to the number of integers in the vector equals one.

20. The method of claim 16 where if the pulse sum is greater than or equal to 15, an exponentially-decaying distribution of integers in the vector is assumed.

* * * * *